United States Patent
Takeuchi et al.

(10) Patent No.: US 6,794,582 B2
(45) Date of Patent: Sep. 21, 2004

(54) MASK FOR SCREEN PRINTING, THE METHOD FOR PRODUCING SAME AND CIRCUIT BOARD PRODUCED BY SCREEN PRINTING WITH SUCH MASK

(75) Inventors: Yukihisa Takeuchi, Nishikamo-Gun (JP); Koji Kimura, Nagoya (JP); Nobuo Takahashi, Owariasahi (JP)

(73) Assignee: NGK Insulators, Ltd., Nagoya (JP)

( * ) Notice: Subject to any disclaimer, the term of this patent is extended or adjusted under 35 U.S.C. 154(b) by 106 days.

(21) Appl. No.: 09/916,990

(22) Filed: Jul. 27, 2001

(65) Prior Publication Data

US 2001/0039891 A1 Nov. 15, 2001

Related U.S. Application Data

(62) Division of application No. 09/435,191, filed on Nov. 5, 1999.

(30) Foreign Application Priority Data

Nov. 6, 1998 (JP) .......................................... 10-316623

(51) Int. Cl.⁷ ................................................. H05K 1/16
(52) U.S. Cl. ...................... 174/260; 174/254; 174/256; 361/760; 361/763; 361/777
(58) Field of Search .................. 174/250, 256, 174/257, 253, 254, 260; 361/763, 765, 766, 777, 782, 793, 748, 760, 761

(56) References Cited

U.S. PATENT DOCUMENTS

| | | | |
|---|---|---|---|
| 3,610,143 A | | 10/1971 | Greenwood et al. |
| 3,769,908 A | | 11/1973 | Griffin |
| 3,889,357 A | * | 6/1975 | Millard et al. .............. 29/25.03 |
| 3,909,680 A | * | 9/1975 | Tsunashima ................. 361/748 |
| 4,084,506 A | | 4/1978 | Nakatani |
| 4,958,560 A | * | 9/1990 | Collins ................... 101/128.21 |
| 5,046,415 A | * | 9/1991 | Oates ..................... 101/128.21 |
| 5,154,121 A | | 10/1992 | Schneider |
| 5,388,509 A | * | 2/1995 | Cutcher .................. 101/128.21 |
| 5,624,782 A | * | 4/1997 | Hayakawa et al. ......... 430/198 |
| 5,935,358 A | * | 8/1999 | Yamasaki ................ 156/89.12 |
| 6,041,496 A | * | 3/2000 | Haq et al. ...................... 29/852 |
| 6,051,448 A | * | 4/2000 | Hayama et al. ............. 438/108 |
| 6,074,893 A | * | 6/2000 | Nakata et al. .............. 438/106 |
| 6,132,543 A | * | 10/2000 | Mohri et al. ............. 156/89.12 |

FOREIGN PATENT DOCUMENTS

| | | | |
|---|---|---|---|
| DE | 3231382 | 3/1984 | ............ 101/128.21 |
| EP | 603966 | 6/1994 | ............. 101/128.4 |
| FR | 2387772 | 12/1978 | ............. 101/128.4 |
| JP | 1824 | 1/1982 | ............. 101/128.4 |
| JP | 19039 | 4/1982 | ............. 101/128.4 |
| JP | 160290 | 7/1987 | ................. 101/127 |
| JP | 85077 | 4/1993 | ................. 101/127 |

* cited by examiner

*Primary Examiner*—David A. Zarneke
*Assistant Examiner*—I B Patel
(74) *Attorney, Agent, or Firm*—Burr & Brown

(57) ABSTRACT

There in provided a circuit board including a substrate on which a plurality of screen-printed patterns are formed. Each of the screen-printed includes at least one of a passive device and an active device. A gap disposed between the plurality of screen-printed patterns is not more than 40 μm.

6 Claims, 10 Drawing Sheets

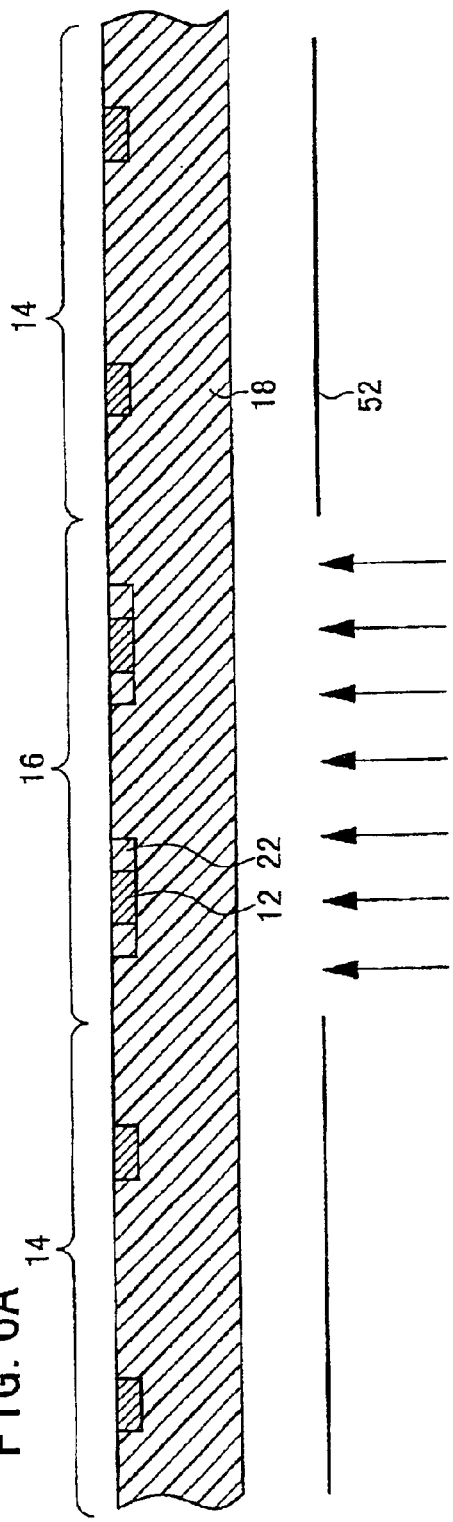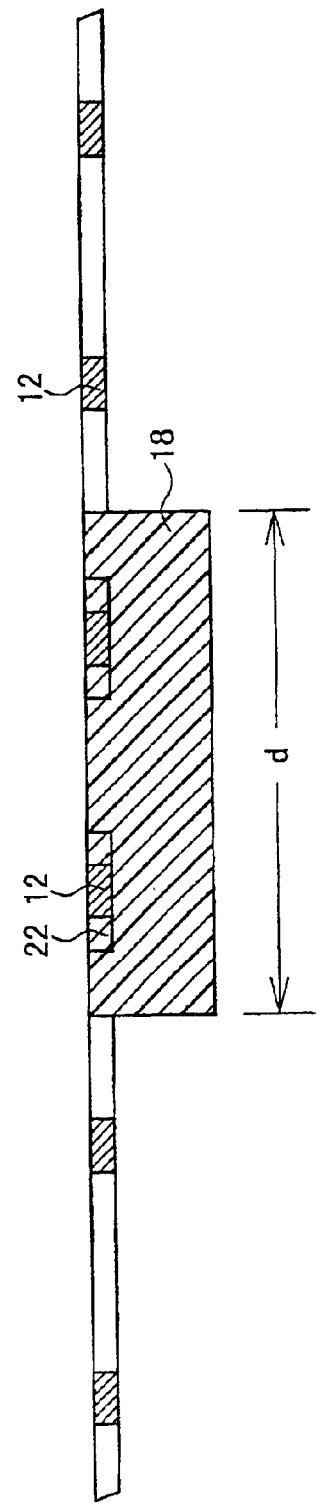

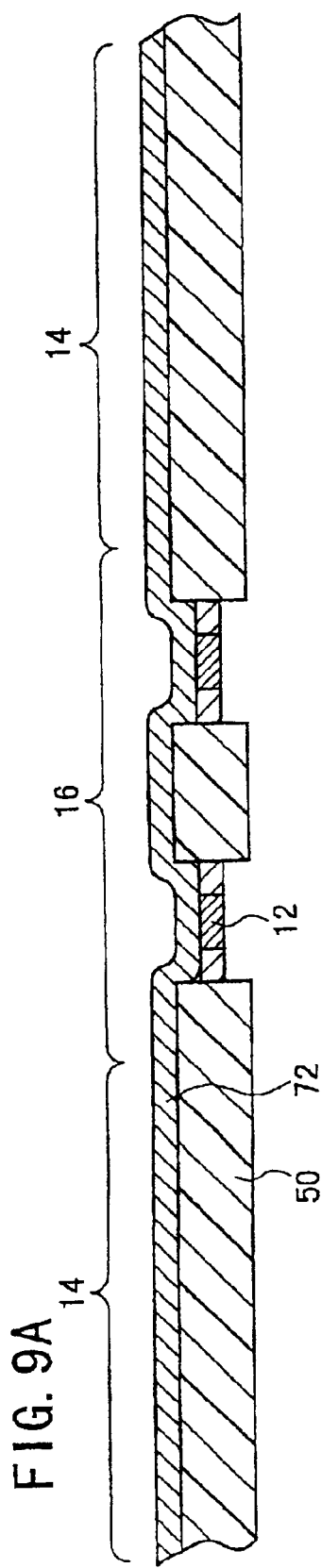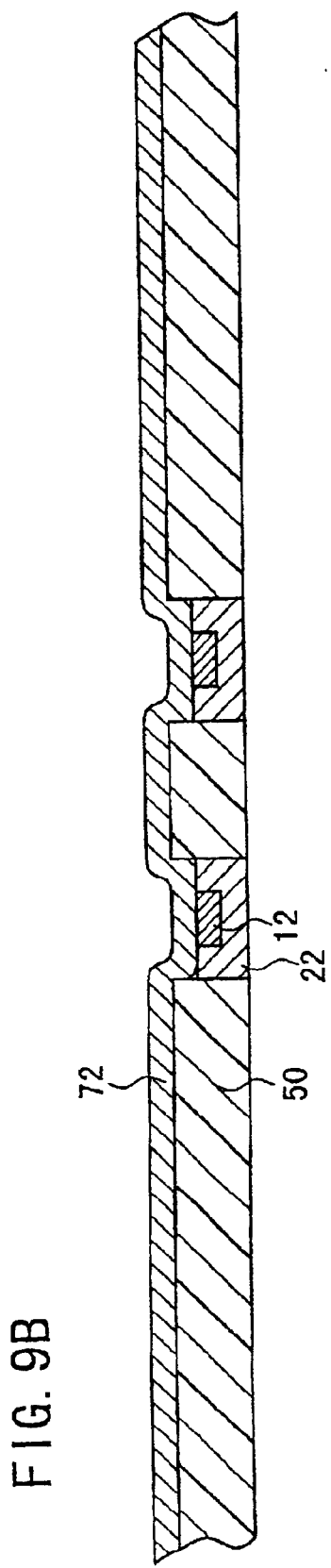
FIG. 9A
FIG. 9B

MASK FOR SCREEN PRINTING, THE METHOD FOR PRODUCING SAME AND CIRCUIT BOARD PRODUCED BY SCREEN PRINTING WITH SUCH MASK

BACKGROUND OF THE INVENTION

1. Field of the Invention

The present invention relates to a mask for screen printing (screen mask) including a positive pattern section and a negative pattern section for transferring a printing ink material to a substrate via mesh openings disposed on the positive pattern section. The present invention also relates to a method for producing such a screen mask, and a circuit board including a wiring pattern having at least a capacitor element, the wiring pattern being formed by screen printing.

2. Description of the Related Art

In general, the screen printing resides in a printing method based on the use of a screen mask comprising a mesh stretched over a frame, the screen mask including mesh openings of a negative pattern section, the mesh openings being closed by resin or the like (for example, a photosensitive emulsion film). In this method, a squeegee is allowed to slide on the upper surface of the screen mask so that an ink material is extruded toward the substrate through mesh openings of a positive pattern section of the screen mask to perform printing.

The screen printing makes it possible to perform printing on a variety of printing materials such as paper, cloth, plastic, glass, and metal, because the screen mask is soft and flexible, and the printing pressure is small. The screen printing also makes it possible to form a thick pattern composed of an ink material. Therefore, the screen printing is also applied to produce electronic parts such as thick film IC (hybrid IC), printed circuit boards, resistors, and capacitors.

Usually, the screen mask is manufactured such that a photosensitive emulsion film applied on a mesh is subjected to pattern formation by means of the photolithography technique. Alternatively, the screen mask is manufactured such that a metal film is subjected to selective etching to form a mesh pattern by means of the photolithography technique.

For example, the portion, at which the ink material is formed on the substrate through the mesh, forms a desired pattern. The portion corresponding to the photosensitive emulsion film formed on the mesh, or the portion corresponding to the non-mesh portion of the metal film forms a gap between the pattern.

In such a process, the mesh opening of the screen mask is about $100 \mu m$ even in the case of the fine type. For example, an emulsion film, which has a width of not more than $40 \mu m$, is insufficiently supported by the mesh. Therefore, it is feared that such an emulsion film formed on the mesh is incapable of enduring the force applied by the sliding movement of the squeegee, and it is disengaged from the mesh.

The screen mask based on the metal film is originally insufficient in strength of the metal film. When the width of the non-mesh portion is not more than $80 \mu m$, such a screen mask is incapable of enduring the force applied by the sliding movement of the squeegee.

In other words, the conventional techniques involve the following problem. That is, even when it is intended to form a gap of not more than $40 \mu m$ between the pattern by means of the one time of screen printing, it is difficult to form such a gap, because of the shortage of the holding force of the emulsion film and the strength of the metal film of the screen mask.

A method is conceived, in which the gap between the pattern is made to be not more than $40 \mu m$ by performing the screen printing several times in a divided manner. However, in such a method, a large dispersion of not less than 10% arises in the difference between the film thickness of a pattern formed by an odd-numbered screen printing process and the film thickness of a pattern formed by an even-numbered screen printing process. For example, when the patterns are wiring patterns, any dispersion arises in the electric characteristic between these wiring patterns. Consequently, a new problem possibly arises in that it is impossible to obtain a desired device characteristic.

SUMMARY OF THE INVENTION

The present invention has been made taking such problems into consideration, an object of which is to provide a screen mask which makes it possible to obtain a gap between the pattern formed by one screen printing, the gap being not more than $40 \mu m$, and which makes it possible to form a fine pattern by using inexpensive screen printing.

Another object of the present invention is to provide a method for producing a screen mask with ease, in which the screen mask makes it possible to obtain a gap between the pattern formed by one screen printing, the gap being not more than $40 \mu m$.

Still another object of the present invention is to provide a circuit board in which a gap between the pattern formed by screen printing is not more than $40 \mu m$.

The present invention lies in a screen mask for screen printing including a positive pattern section and a negative pattern section with a mask material formed on the negative pattern section, for transferring a printing ink material to a substrate via openings of a mesh disposed at the positive pattern section, wherein the negative pattern section of the mesh selectively has a mesh opening ratio which is smaller than an opening ratio of the positive pattern section.

When the mesh opening ratio of the negative pattern section is decreased, then the width of each mesh of the negative pattern section is widened, and the contact area between the mask material and the mesh is increased. Accordingly, for example, it is possible to sufficiently hold a mask material which has a width of not more than $40 \mu m$.

As a result, the mask material, which is formed on the mesh, is sufficiently endurable to the force applied by the sliding movement of a squeegee during the screen printing. Thus, the mask material is not disengaged from the mesh. This results in the high reliability and the narrow width of the pattern gap formed by the screen printing. The width of the gap, which is formed on the substrate by the negative pattern section, can be made to be not more than $40 \mu m$. In other words, it is possible to form a fine pattern by using the inexpensive screen printing. Thus, it is possible to greatly reduce the production cost for forming the pattern.

In this arrangement, it is also preferable that a plating layer is formed on the mesh of the negative pattern section so that the mesh opening ratio of the negative pattern section is decreased. It is preferable that the plating layer has a thickness of 1 to $20 \mu m$, for example, in view of the plating treatment time and the holding force of the emulsion film.

In another aspect, the present invention lies in a screen mask for screen printing including a positive pattern section and a negative pattern section, for transferring a printing ink material to a substrate via openings of a mesh disposed at the positive pattern section, wherein the negative pattern section has a mesh opening ratio of zero.

That is, the screen mask has a form in which the negative pattern section is completely closed. Therefore, it is unnecessary to form any mask material on the negative pattern section, and it is possible to simplify the production steps. Further, it is unnecessary to consider, for example, the disengagement of the mask material. Therefore, it is possible to achieve the high reliability and the narrow width of the pattern gap obtained by the screen printing. The width of the gap, which is formed on the substrate by the negative pattern section, can be not more than 40 μm.

In this arrangement, it is also preferable that the mesh opening ratio of the negative pattern section is made to be zero by forming a plating layer on the mesh of the negative pattern section.

In still another aspect, the present invention lies in a method for producing a screen mask for screen printing including a positive pattern section and a negative pattern section with a mask material formed on the negative pattern section, for transferring a printing ink material to a substrate via openings of a mesh disposed at the positive pattern section, wherein a plating treatment is selectively applied beforehand to the mesh of the negative pattern section so that the negative pattern section has a mesh opening ratio which is smaller than an opening ratio of the positive pattern section.

Accordingly, the width of each mesh of the negative pattern section is widened, and the contact area between the mask material and the mesh is increased. Therefore, for example, it is possible to sufficiently hold a mask material having a width of not more than 40 μm.

As a result, it is possible to consequently obtain the high reliability and the narrow width of the pattern gap formed by the screen printing. The width of the gap, which is formed on the substrate by the negative pattern section, can be made to be not more than 40 μm.

In the method described above, it is also preferable that at least a surface of both surfaces of a screen, on which a squeegee makes sliding movement, is polished after the plating treatment to give a flatness. Alternatively, it is also preferable that a plating mask material is formed before the plating treatment on a surface of both surfaces of a screen, on which a squeegee makes sliding movement so that the plating layer is not formed on the surface.

It is preferable that a plating layer is composed of a material which has a hardness lower than that of a screen so that the polishing treatment is easily performed.

In still another aspect, the present invention lies in a circuit board comprising a pattern formed by screen printing, the pattern including at least one of a passive device such as a capacitor element and an active device such as an electromechanical conversion element, wherein a gap between the pattern is not more than 40 μm.

In the present invention, it is also preferable that the pattern is formed by one time of screen printing.

Conventionally, it is impossible to obtain a fine gap screen mask. Therefore, when a gap of not more than 40 μm is formed, it is indispensable to perform a plurality of times of screen printing. However, it is inevitable that a printing pattern obtained in the second time is not formed under the same printing condition as that for a printing pattern obtained in the first time. For this reason, it is difficult to obtain a uniform film thickness.

On the contrary, in the present invention, the entire pattern can be formed by one time of screen printing. Therefore, it is possible to obtain a uniform film thickness. In this aspect, if it is assumed that a plurality of patterns are formed in an aligned manner, the difference between an average thickness of a pattern corresponding to a pattern assumed to be formed by an odd-numbered operation and an average thickness of a pattern corresponding to a pattern assumed to be formed by an even-numbered operation is not more than 5% of an overall average thickness.

It is also preferable that the screen printing is performed by using a screen mask including a positive pattern section and a negative pattern section with a mask material formed on the negative pattern section, for transferring a printing ink material to a substrate via openings of a mesh disposed at the positive pattern section, wherein the negative pattern section of the mesh selectively has a mesh opening ratio which is smaller than an opening ratio of the positive pattern section.

It is also preferable that a plating layer is formed on the mesh of the negative pattern section of the screen mask. In this arrangement, it is preferable that the plating layer has a thickness of 1 to 20 μm.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIGS. 6A and 6B show steps (No. 3) illustrating the method for producing the screen mask according to the embodiment of the present invention;

FIG. 9A illustrates a state in which one surface of a mesh is coated with a masking film before the plating treatment;

FIG. 9B illustrates a state in which the plating treatment has been applied.

DESCRIPTION OF THE PREFERRED EMBODIMENTS

Illustrative embodiments of the screen mask, the method for producing the same, and the circuit board according to the present invention will be explained below with reference to FIGS. 1 to 10.

Figure 1:
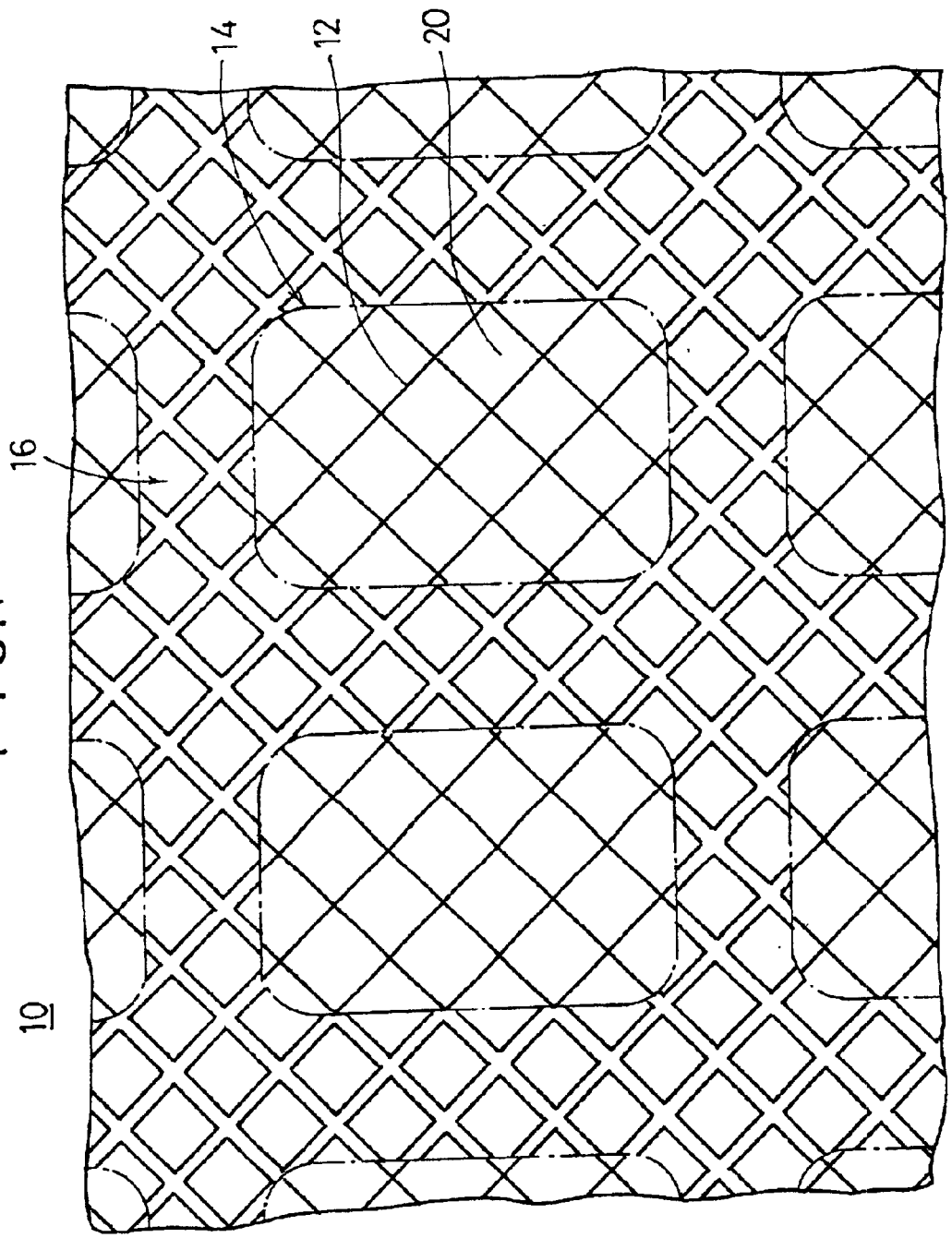
FIG. 1 shows a plan view illustrating a screen mask according to an embodiment of the present invention.

As shown in FIG. 1, a screen mask 10 according to the embodiment of the present invention is a screen mask for screen printing, comprising a positive pattern section 14 and a negative pattern section 16 formed on a mesh 12. A photosensitive emulsion film 18 (see FIG. 6B), which serves as a mask material, is formed on the negative pattern section 16. An ink is transferred to a substrate via mesh openings 20 of the positive pattern section 14.

Especially, the screen mask 10 according to this embodiment is constructed such that the negative pattern section 16 of the mesh 12 selectively has a mesh opening ratio which is smaller than a mesh opening ratio of the positive pattern section 14. Specifically, the mesh opening ratio of the negative pattern section 16 is made small by forming a plating layer 22 (see FIG. 6B) on the mesh 12 of the negative pattern section 16.

Figure 2:
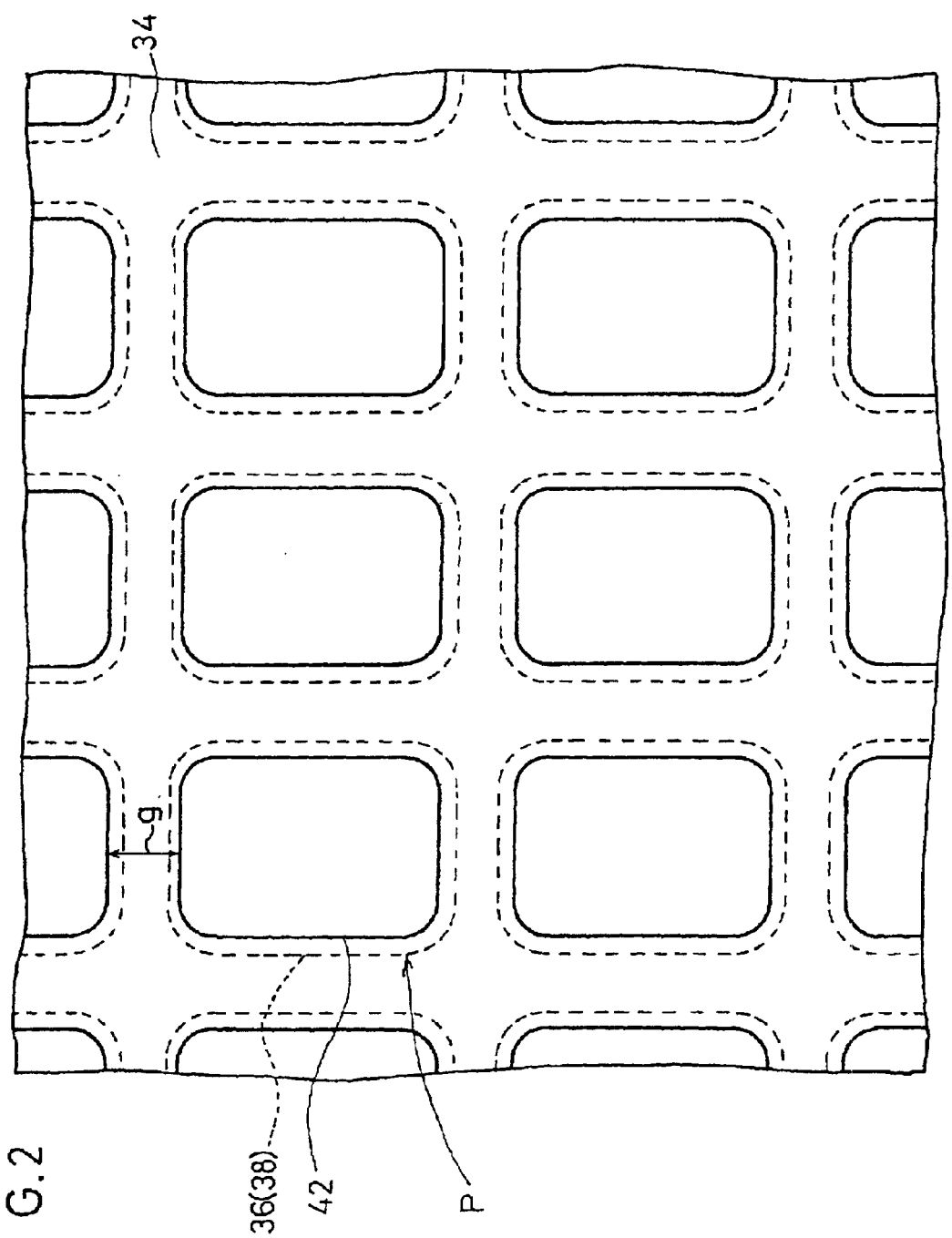
FIG. 2 shows a plan view illustrating a pattern formed by using the screen mask according to the embodiment of the present invention.

For example, when the screen printing is applied to a substrate such as a ceramic substrate by using the screen mask 10 shown in FIG. 1, a pattern P is formed as shown in FIG. 2, in which projections having a rectangular planar configuration with rounded corners are arranged in a matrix form.

Figure 3:
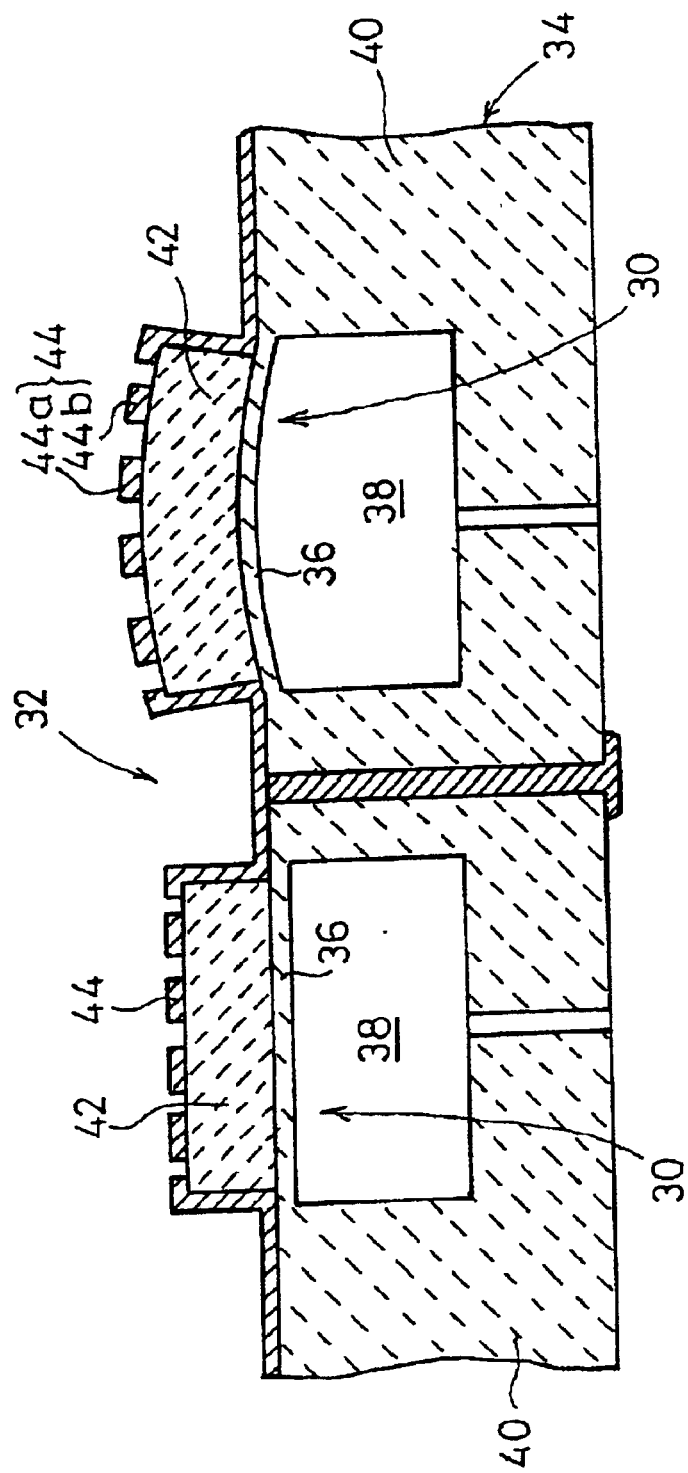
FIG. 3 shows a longitudinal sectional view illustrating the pattern formed by using the screen mask according to the embodiment of the present invention.

The ink to be used for the screen printing may be embodied by a paste for producing a shape-retaining layer such as a piezoelectric/electrostrictive layer and an anti-ferroelectric layer. In this case, as shown in FIG. 3, for example, it is possible to construct a circuit board 32 arranged with actuator elements 30 each composed of an electromechanical conversion element to equivalently function as a capacitor element.

The circuit board 32 has a substrate 34 which is composed of, for example, a ceramic material. The actuator elements 30 are arranged on the substrate 34, for example, in a matrix form. The substrate 34 is provided with hollow spaces 38 for forming vibrating sections 36 at positions at which the actuator elements 30 are formed respectively.

The portion of the substrate 34, at which the hollow space 38 is formed, is thin-walled. The other portion of the substrate 34 is thick-walled. The thin-walled portion has a structure which tends to undergo vibration in response to external stress, and it functions as the vibrating section 36. The portion other than the hollow space 38 is thick-walled, and it functions as a fixed section 40 for supporting the vibrating section 36.

Each of the actuator elements 30 includes the vibrating section 36 and the fixed section 40, as well as a shape-retaining layer 42 such as a piezoelectric/electrostrictive layer and an anti-ferroelectric layer formed directly on the vibrating section 36, and a pair of electrodes 44 (row electrode 44$a$ and column electrode 44$b$) formed on the upper surface of the shape-retaining layer 42. The actuator element 30 makes upward or downward displacement by applying a predetermined voltage to the pair of electrodes 44. FIG. 3 is illustrative of a case in which the actuator element 30 is displaced upwardly.

Next, a method for producing the screen mask according to the embodiment of the present invention will be explained with reference to FIGS. 4A to 6B.

Figure 4A:
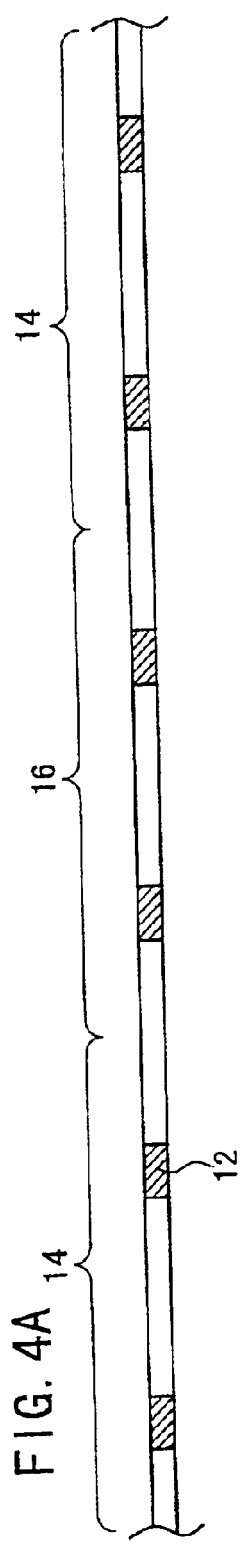
FIGS. 4A to 4C show steps (No. 1) illustrating a method for producing the screen mask according to the embodiment of the present invention.

At first, as shown in FIG. 4A, for example, a commercially available stainless mesh for screen, which has an ordinary mesh 12, is prepared.

Figure 4B:
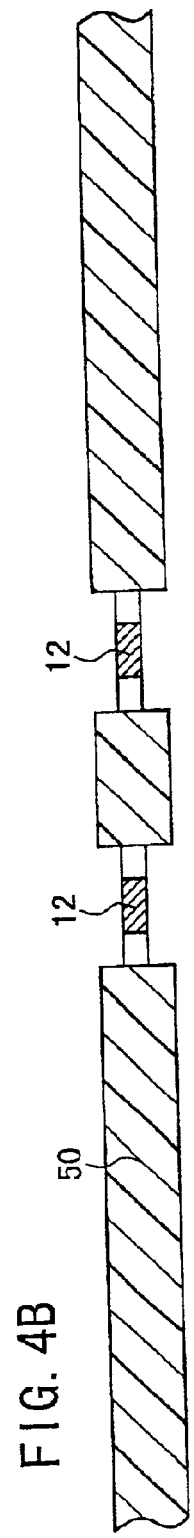

Subsequently, as shown in FIG. 4B, a photoresist film 50 is formed on the entire surface, followed by performing a selective etching treatment to expose the mesh 12 at portions corresponding to the negative pattern section 16.

Figure 4C:
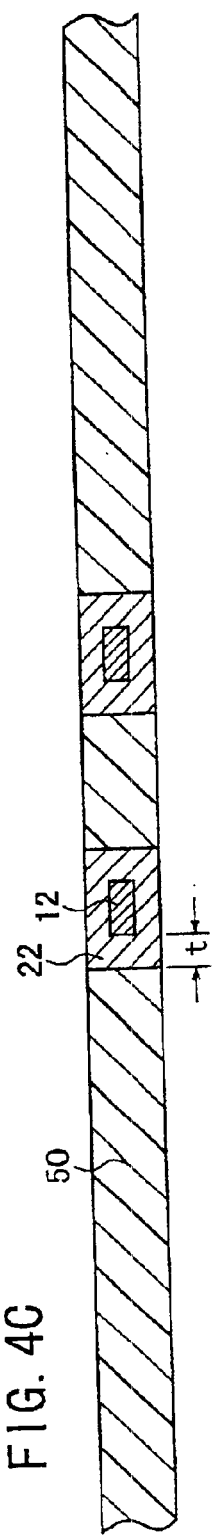

After that, as shown in FIG. 4C, a plating treatment is applied to form a plating layer 22 having a thickness t of about 1 to 20 $\mu$m on the mesh 12 at the portions corresponding to the negative pattern section 16.

Figure 5A:
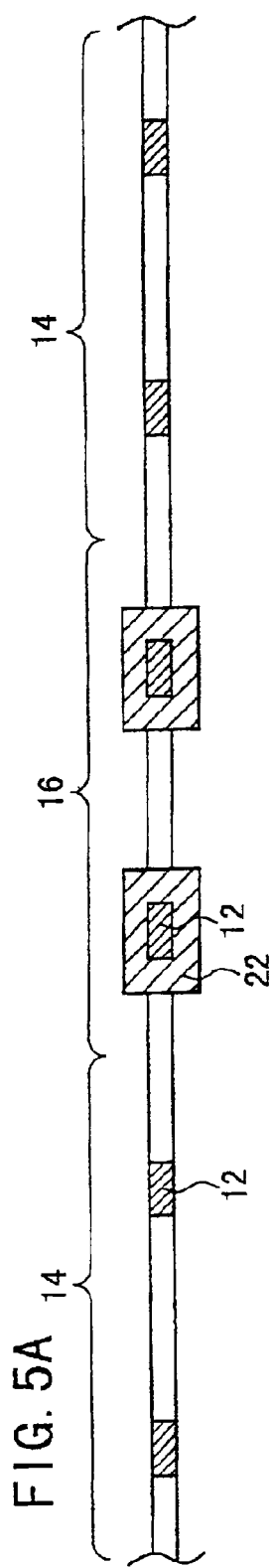
FIGS. 5A and 5B show steps (No. 2) illustrating the method for producing the screen mask according to the embodiment of the present invention.

Subsequently, as shown in FIG. 5A, the remaining photoresist film 50 is removed by etching to expose the entire mesh 12.

Figure 5B:
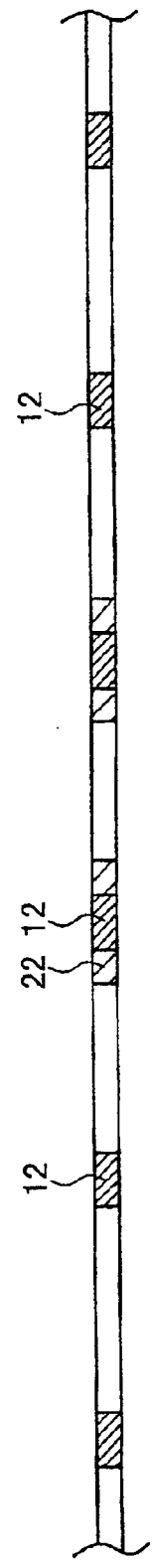

After that, as shown in FIG. 5B, both surfaces of the mesh 12 is subjected to buffing so that the part of the plating layer 22 protruding from the both surfaces of the mesh 12 is removed to be flat.

Subsequently, as shown in FIG. 6A, a photosensitive emulsion film 18 is formed on one surface of the mesh 12, and then the negative pattern section 16 is selectively subjected to exposure by using a mask 52 to solidify the emulsion film 18 at portions corresponding to the negative pattern section 16.

Finally, as shown in FIG. 6B, a development treatment is performed to remove the part of the emulsion film 18 which is not solidified. Thus, the screen mask 10 is completed, in which the mask material (emulsion film) 18 is formed on the negative pattern section 16.

Next, explanation will be made for the process operation performed when the screen printing (for example, flatbed screen printing) is performed by using the screen mask 10 according to the embodiment of the present invention.

Figure 7A:
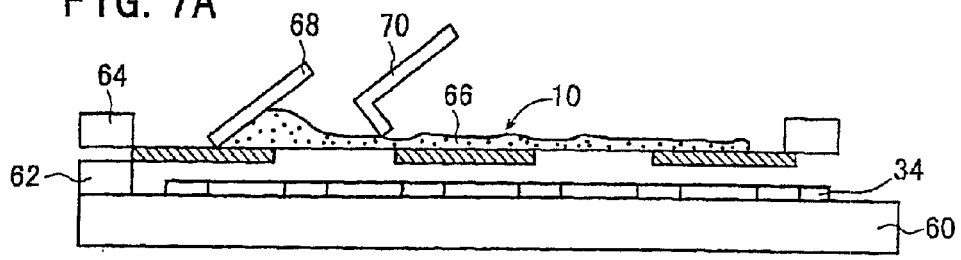
FIGS. 7A to 7D show steps illustrating the process operation performed when the screen printing (for example, flatbed printing) is carried out by using the screen mask according to the embodiment of the present invention.

At first, as shown in FIG. 7A, a substrate 34 is placed and fixed on a printing base 60. After that, a frame 64 of the screen mask 10 is rotatably fixed to a support section 62 which is provided on the printing base 60. A holding adjusting mechanism included in the support section 62 is adjusted to position the screen mask 10 and the substrate 34.

Figure 7B:
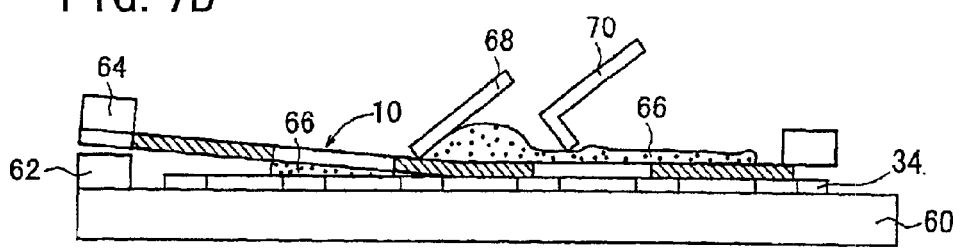

Subsequently, as shown in FIG. 7B, an ink 66 (paste for forming the shape-retaining layer 42) is supplied to the entire surface of the screen mask 10, and then a squeegee 68 is allowed to slide on the screen mask 10 under a pressure. The sliding movement of the squeegee 68 allows the ink 66 to advance toward the substrate 34 through the mesh openings 20 of the positive pattern section 14 of the screen mask 10.

Figure 7C:
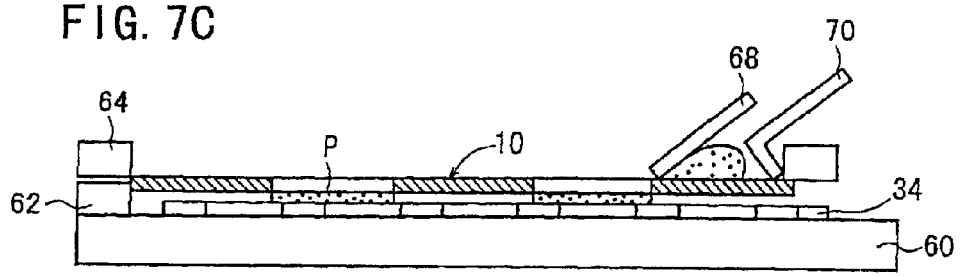

As shown in FIG. 7C, a pattern in conformity with the shape of the positive pattern section 14, for example, the pattern P including a large number of rectangular shape-retaining layers 42 arranged in the matrix form as shown in FIG. 2 is formed on the substrate 34 at the stage of completion of the printing.

During this process, the ink 66 is separated in a well-suited manner through the mesh openings 20 of the positive pattern section 14 by allowing the squeegee 68 to make the sliding movement while lifting the frame 64 corresponding to the support section 62. Especially, in the embodiment of the present invention, the emulsion film 18 is formed on the mesh 12 of the negative pattern section 16. Therefore, the edge of the pattern P formed on the substrate 34 is sharp. Thus, it is possible to form the pattern P highly accurately in accordance with the designed pattern.

Figure 7D:
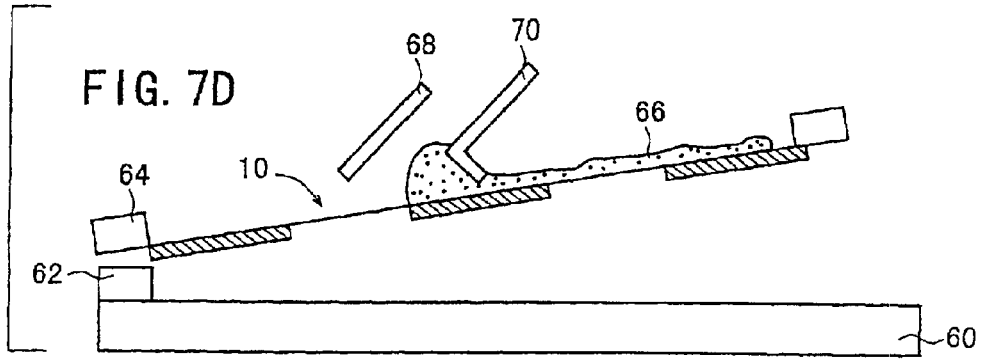

After the completion of the printing, the squeegee 68 is separated from the screen mask 10 as shown in FIG. 7D, and the substrate 34 is detached from the printing base 60. Subsequently, a flooding plate 70 is moved downwardly, and it is allowed to slide toward the support section 62 to perform flooding.

The desired pattern P is screen-printed on a large number of substrates 34 by repeating the series of operations described above.

As described above, in the screen mask 10 according to the embodiment of the present invention, the plating layer 22 is selectively formed on the mesh 12 of the negative pattern section 16 so that the mesh opening ratio of the negative pattern section 16 is smaller than the mesh opening ratio of the positive pattern section 14. Therefore, the width of each mesh 12 of the negative pattern section 16 is widened to increase the contact area between the mesh 12 and the emulsion film 18 as the mask material. Thus, it is possible to sufficiently hold the emulsion film 18 having the width d (see FIG. 6B) which is, for example, not more than 40 μm.

As a result, the emulsion film 18, which is formed on the mesh 12, is sufficiently endurable to the force which is applied due to the sliding movement of the squeegee 68 during the screen printing. Thus, the emulsion film 18 is not disengaged from the mesh 12. This results in the high reliability and the narrow width of the pattern gap formed by the screen printing. The width g of the gap (see FIG. 2) of the pattern P (pattern of the shape-retaining layer 42), which is formed on the substrate 34 by the negative pattern section 16, can be not more than 40 μm.

The thickness of the plating layer 22 is preferably 1 to 20 μm, considering, for example, the plating treatment time and the holding force of the emulsion film 18.

Especially, in the screen mask 10 and the method for producing the same according to the embodiment of the present invention, the both surfaces of the mesh 12 are polished after the plating treatment to give the flatness. Accordingly, the presence of the plating layer 22 causes no problem at all on the sliding movement of the squeegee 68. Therefore, it is preferable that the plating layer 22 is composed of the material which has a hardness lower than that of the mesh 12 and which is easily polished.

The foregoing embodiment is illustrative of the case in which the pattern with the gap g of not more than 40 μm is formed by one time of screen printing. It is a matter of course that a pattern with a gap g of not more than 40 μm is formed by a plurality of times of screen printing.

Conventionally, it is impossible to obtain a fine gap screen mask. Therefore, when a gap of not more than 40 μm is formed, it is indispensable to perform a plurality of times of screen printing. However, it is inevitable that a printing pattern obtained in the second time is not formed under the same printing condition as that for a printing pattern obtained in the first time. For this reason, it is difficult to obtain a uniform film thickness.

On the contrary, in the present invention, the entire pattern can be formed by one time of screen printing. Therefore, it is possible to obtain a uniform film thickness. In the case of the present invention, if it is assumed that a plurality of patterns are formed in an aligned manner, the difference between an average thickness of a pattern corresponding to a pattern assumed to be formed by an odd-numbered operation and an average thickness of a pattern corresponding to a pattern assumed to be formed by an even-numbered operation can be not more than 5% of an overall average thickness.

As a result, when the pattern P formed by the screen printing is a wiring pattern equivalently having a capacitor element as shown in FIGS. 2 and 3, then no dispersion arises in electric characteristic of the element pattern, and it is possible to obtain a desired device characteristic.

Figure 8A:
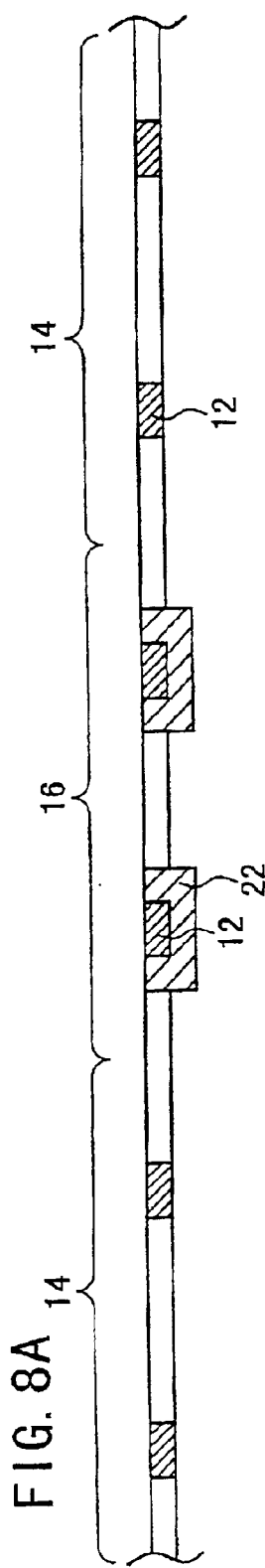
FIG. 8A illustrates a state in which only one surface of a mesh is polished.
Figure 8B:
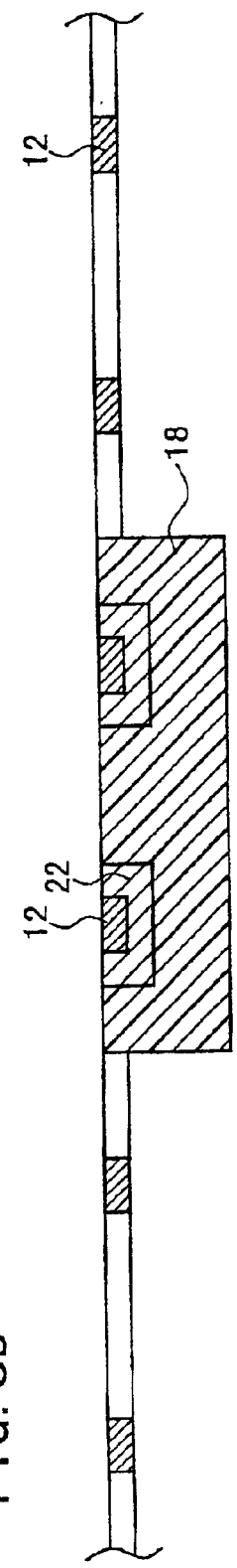
FIG. 8B illustrates a state in which an emulsion film is formed at a negative pattern section.

In the foregoing embodiment, the both surfaces of the mesh 12 are polished. Alternatively, as shown in FIG. 8A, only the surface, on which the squeegee 68 makes the sliding movement, may be polished to give a flatness to the concerning surface. In this case, as shown in FIG. 8B, when the emulsion film 18 is formed on the negative pattern section 16, the contact area between the plating layer 22 and the emulsion film 18 is greatly increased. Further, the emulsion film 18 can be tightly held owing to the anchoring effect brought about by the shape of the plating layer 22.

In the foregoing embodiment, the plating layer 22 are formed on the both surfaces of the mesh 12 of the negative pattern section 16. Alternatively, as shown in FIG. 9A, one surface of the mesh 12 (surface on which the squeegee 68 makes the sliding movement) is previously coated with a masking film 72 before the plating treatment. By doing so, the plating layer 22 is not formed on the surface for the sliding movement of the squeegee 68, of the mesh 12 of the negative pattern section 16, in the plating treatment performed thereafter as shown in FIG. 9B. Thus, it is possible to shorten the time required for the polishing treatment to be performed thereafter.

Figure 10:
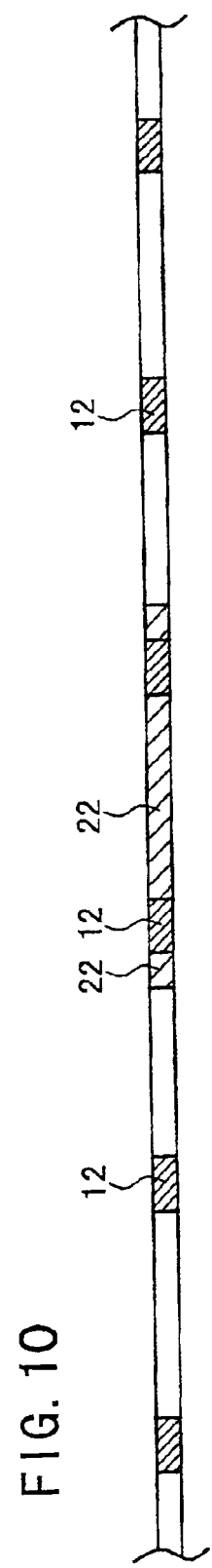
FIG. 10 illustrates a state in which openings of a negative pattern section are closed with a plating layer.

In the foregoing embodiment, the plating layer 22 is formed in a thickness of about 1 to 20 μm on the mesh 12 of the negative pattern section 16 so that the mesh opening ratio of the negative pattern section 16 is smaller than the opening ratio of the positive pattern section 14. Alternatively, as shown in FIG. 10, the openings of the negative pattern section 16 may be completely closed with the plating layer 22. That is, the mesh opening ratio of the negative pattern section 16 may be zero.

In this case, the negative pattern section 16 is in the state of being completely closed. Therefore, it is unnecessary to form the mask material (emulsion film 18) on the negative pattern section 16, and hence it is possible to simplify the production steps. Further, it is unnecessary to consider, for example, the disengagement of the mask material (emulsion film 18). Therefore, it is possible to achieve the high reliability and the narrow width of the pattern gap obtained by the screen printing. The width g of the gap, which is formed on the substrate 34 by using the negative pattern section 16, can be not more than 40 μm.

The embodiment described above is illustrative of the case in which the actuator element 30 having the shape-retaining layer 42 is formed on the substrate 34 by means of the screen printing. Alternatively, for example, the present invention is also applicable to a case in which metal wiring is formed on a substrate.

It is a matter of course that the screen mask, the method for producing the same, and the circuit board according to the present invention are not limited to the embodiments described above, which may be embodied in other various forms without deviating from the gist or essential characteristics of the present invention.

What is claimed is:

1. A circuit board comprising:

a substrate;

a plurality of screen-printed patterns formed on said substrate, each of said screen-printed patterns including at least one of a passive device an active device; and a gap disposed between said plurality of screen-printed patterns, wherein said gap is not more than 40 μm.

2. The circuit board according to claim 1, wherein:

said plurality of screen-printed patterns are formed in an aligned manner on said substrate;

a difference between an average thickness of odd-numbered patterns and an average thickness of even-numbered patterns is not more than 5% of an overall average thickness.

3. The circuit board according to claim 1, wherein each of said screen printed patterns comprises a printing ink material applied on said substrate by a mask including a positive pattern section and a negative pattern section with a mask material formed on said negative pattern section, wherein said printing ink material is transferred to said substrate via openings of a mesh disposed at said positive pattern section, and wherein:

said negative pattern section of said mesh selectively has a mesh opening ratio which is smaller than an opening ratio of said positive pattern section.

4. The circuit board according to claim 3, wherein a plating layer is formed on said mesh of said negative pattern section of said mask, wherein said plating layer has a thickness of 1 to 20 $\mu$m, and wherein said printing ink is not applied to said substrate corresponding to positions on said mask where said plating layer is formed.

5. The circuit board according to claim 1, wherein said plurality of screen-printed patterns comprises a single screen-printed layer on said substrate formed by a one time screen printing application.

6. The circuit board according to claim 1, wherein:

said plurality of screen-printed patterns are formed in an aligned manner on said substrate; and a difference between thicknesses of two adjacent patterns is not more than 5% of an overall average thickness.

* * * * *

UNITED STATES PATENT AND TRADEMARK OFFICE
CERTIFICATE OF CORRECTION

PATENT NO. : 6,794,582 B2
DATED : September 21, 2004
INVENTOR(S) : Yukihisa Takeuchi, Koji Kimura and Nobuo Takahashi It is certified that error appears in the above-identified patent and that said Letters Patent is hereby corrected as shown below:

Title page,
Item [57], ABSTRACT,
Line 1, change "in" to -- is --
Line 33, add -- patterns -- after "screen-printed"

Column 1,
Line 5, add
-- CROSS REFERENCE TO RELATED APPLICATION
    This is a divisional application U.S. Serial No. 09/435,191, filed November 5, 1999, the entirety of which is incorporated herein by reference. --

Column 8,
Line 56, add -- and -- after the first occurrence of "device"

Signed and Sealed this

Eighth Day of February, 2005

JON W. DUDAS
*Director of the United States Patent and Trademark Office*

UNITED STATES PATENT AND TRADEMARK OFFICE
CERTIFICATE OF CORRECTION

PATENT NO.         : 6,794,582 B2                                          Page 1 of 1
APPLICATION NO. : 09/916990
DATED              : September 21, 2004
INVENTOR(S)        : Yukihisa Takeuchi, Koji Kimura and Nobuo Takahashi It is certified that error appears in the above-identified patent and that said Letters Patent is hereby corrected as shown below:

Item (57) Abstract
Line 1, Change "in" to -- is --
Line 3, Add -- patterns -- after "screen-printed"

Column 1
After the Title and before the first line, Add
-- Cross Reference to Related Application
       This is a divisional application of U.S. Serial No. 09/435,191, filed November 5, 1999, the entirety of which is incorporated herein by reference. --

Column 8
Line 56, Add -- and -- after the first occurrence of "device"

Signed and Sealed this

First Day of July, 2008

JON W. DUDAS
*Director of the United States Patent and Trademark Office*